(12) United States Patent
Cho et al.

(10) Patent No.: US 12,614,577 B2
(45) Date of Patent: Apr. 28, 2026

(54) NONVOLATILE MEMORY DEVICE, STORAGE DEVICE HAVING THE SAME, AND OPERATING METHOD THEREOF

(71) Applicant: Samsung Electronics Co., Ltd., Suwon-si (KR)

(72) Inventors: Siyeon Cho, Suwon-si (KR); Daewon Ha, Suwon-si (KR); Myunghun Woo, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 165 days.

(21) Appl. No.: 18/407,797

(22) Filed: Jan. 9, 2024

(65) Prior Publication Data

US 2025/0029647 A1      Jan. 23, 2025

(30) Foreign Application Priority Data

Jul. 18, 2023      (KR) ........................ 10-2023-0093012

(51) Int. Cl.
*G11C 16/04*      (2006.01)
*G11C 11/22*      (2006.01)

(52) U.S. Cl.
CPC ........ *G11C 11/2275* (2013.01); *G11C 11/223* (2013.01); *G11C 11/2277* (2013.01)

(58) Field of Classification Search
CPC .............. G11C 11/2275; G11C 11/223; G11C 11/2277
See application file for complete search history.

(56) References Cited

U.S. PATENT DOCUMENTS

| | | | |
|---|---|---|---|
| 9,514,828 B2 | 12/2016 | Shim | |
| 10,020,062 B1 | 7/2018 | Oh et al. | |
| 10,600,486 B2 | 3/2020 | Yun et al. | |
| 11,456,319 B2 | 9/2022 | Song et al. | |
| 11,574,693 B2 | 2/2023 | Chen et al. | |
| 2016/0141043 A1 | 5/2016 | Lee | |
| 2021/0384221 A1* | 12/2021 | Song | G11C 11/5657 |
| 2022/0199164 A1 | 6/2022 | Kim et al. | |
| 2022/0415415 A1* | 12/2022 | Tseng | G11C 16/26 |
| 2023/0019540 A1 | 1/2023 | Song et al. | |
| 2023/0049605 A1 | 2/2023 | Tomiie | |
| 2023/0067813 A1 | 3/2023 | Kim et al. | |

* cited by examiner

*Primary Examiner* — Min Huang
(74) *Attorney, Agent, or Firm* — Wolf, Greenfield & Sacks, P.C.

(57) ABSTRACT

A method of operating a nonvolatile memory device includes applying a ground voltage to a selected wordline among the wordlines, applying an erase pass voltage to at least one unselected wordline among the wordlines, applying an erase voltage to a selected bitline among the bitlines, applying an erase prohibition voltage to an unselected bitline among the bitlines, and applying a Gate Induced Drain Leakage (GIDL) voltage to at least one string selection line corresponding to a string selected from among the plurality of strings.

20 Claims, 11 Drawing Sheets

Perform program operation using ISPP ⟍ S110

Perform erase operation using GIDL ⟍ S120

416

Ferroelectric Layer
(Single Layer)

416a

Ferroelectric Layer

← Inter layer

Ferroelectric Layer

← Inter layer

Ferroelectric Layer

|  | Sel. BL | | Unsel. BL | |
|---|---|---|---|---|
| BL | 10V | | 4V | |
|  | Sel. SSL | Unsel. SSL | Sel. SSL | Unsel. SSL |
| SSL (GIDL_Tr.) | 2V | 10V | 2V | 10V |
| Unsel. WL | 7V | | | |
| Sel. WL | GND or 0V | | | |
| GSL | Floating | | | |
| CSL | Floating | | | |

|  | Sel. BL | | Unsel. BL | |
|---|---|---|---|---|
| BL | 10V | | 4V | |
|  | Sel. SSL | Unsel. SSL | Sel. SSL | Unsel. SSL |
| SSL1 (GIDL_Tr.) | 2V | 10V | 2V | 10V |
| SSL2 | 2V | 4V | 2V | 4V |
| Unsel. WL | 7V | | | |
| Sel. WL | GND or 0V | | | |
| GSL | Floating | | | |
| CSL | Floating | | | |

NONVOLATILE MEMORY DEVICE, STORAGE DEVICE HAVING THE SAME, AND OPERATING METHOD THEREOF

CROSS-REFERENCE TO RELATED APPLICATION(S)

This application claims the benefit under 35 USC 119 (a) of Korean Patent Application No. 10-2023-0093012 filed on Jul. 18, 2023, in the Korean Intellectual Property Office, the entire disclosure of which is incorporated herein by reference for all purposes.

FIELD

The present inventive concept relates to a nonvolatile memory device, a storage device having the same, and a method of operating the same.

BACKGROUND

In general, as a nonvolatile memory, a flash memory may retain data stored therein even when power is turned off. Storage devices including flash memory, such as embedded Multi-Media Card (eMMC), Universal Flash Storage (UFS), Solid State Drive (SSD), and memory cards, may be widely used. Storage devices may be useful for storing or moving large amounts of data. Demand for technology that may improve the reliability of storage devices continues to arise.

SUMMARY

Example embodiments provide a nonvolatile memory device in which threshold voltage distribution may be improved or erase efficiency may be increased, a storage device having the same, and a method of operating the same.

According to example embodiments, in a method of operating a nonvolatile memory device including a plurality of strings provided in a direction that is perpendicular to a substrate, and connected between respective bitlines and a common source line, each of the plurality of strings including at least one string selection transistor, a plurality of memory cells corresponding to wordlines, and at least one ground selection transistor, each of the plurality of memory cells having a ferroelectric material, the method includes applying a ground voltage to a selected wordline among the wordlines; applying an erase pass voltage to at least one unselected wordline among the wordlines; applying an erase voltage, which is greater than the erase pass voltage, to a selected bitline among the bitlines; applying an erase prohibition voltage, which is less than the erase pass voltage, to an unselected bitline among the bitlines; and applying a Gate Induced Drain Leakage (GIDL) voltage to at least one string selection line corresponding to a selected string from among the plurality of strings.

According to example embodiments, a nonvolatile memory device includes a first string electrically connected between a first bitline and a common source line; a second string electrically connected between a second bitline and the common source line; a third string electrically connected between the first bitline and the common source line; and a fourth string electrically connected between the second bitline and the common source line. Each of the first, second, third, and fourth strings includes a first string selection transistor having a gate electrically connected to a first string selection line, a second string selection transistor having a gate electrically connected to a second string selection line, a plurality of memory cells having respective gates electrically connected to respective ones of a plurality of wordlines, and a ground selection transistor having a gate electrically connected to a ground selection line, and each of the plurality of memory cells has a ferroelectric material. The first string selection line, the second string selection line, the plurality of wordlines, and the ground selection line are sequentially disposed in a direction that is perpendicular to a substrate. In an erase operation, based on an address, the first string electrically connected to the first bitline is selected, and the second, third, and fourth strings are unselected. In the erase operation, a Gate Induced Drain Leakage (GIDL) voltage is applied to the first string selection line and the second string selection line corresponding to the first string and the second string, respectively. In the erase operation, different shut-off voltages are applied to the first string selection line and the second string selection line corresponding to the third string and the fourth string, respectively.

According to example embodiments, in a method of operating a nonvolatile memory device, the nonvolatile memory device including a plurality of strings provided in a direction that is perpendicular to a substrate, and connected between respective bitlines and a common source line, each of the plurality of strings including at least one string selection transistor, a plurality of memory cells corresponding to wordlines, and at least one ground selection transistor, each of the plurality of memory cells having a ferroelectric material, the method includes performing a program operation on a selected memory cell from among the plurality of memory cells using Incremental Step Pulse Programming (ISPP); and performing an erase operation on the selected memory cell using Gate Induced Drain Leakage (GIDL).

According to example embodiments, a storage device includes a nonvolatile memory package; and a controller configured to control the nonvolatile memory package to perform a program operation and an erase operation. The nonvolatile memory package includes a plurality of strings extending in a direction that is perpendicular to a substrate, and electrically connected between respective bitlines and a common source line. Each of the plurality of strings includes at least one string selection transistor, a plurality of memory cells corresponding to wordlines, and at least one ground selection transistor. Each of the plurality of memory cells has a ferroelectric material, and each of the plurality of memory cells is configured to collect a threshold voltage distribution in a first direction during the program operation, and is configured to collect a threshold voltage distribution in a second direction different from the first direction during the erase operation. The erase operation is performed on a cell basis, string basis, string selection line basis, or plane basis, among the plurality of memory cells, among the plurality of strings, among string selection lines, or among planes of the nonvolatile memory package, respectively, using Gate Induced Drain Leakage (GIDL).

BRIEF DESCRIPTION OF DRAWINGS

The above and other aspects, features, and advantages of the present inventive concept will be more clearly understood from the following detailed description, taken in conjunction with the accompanying drawings, in which.

US 12,614,577 B2

3

Figures 4A, 4B:
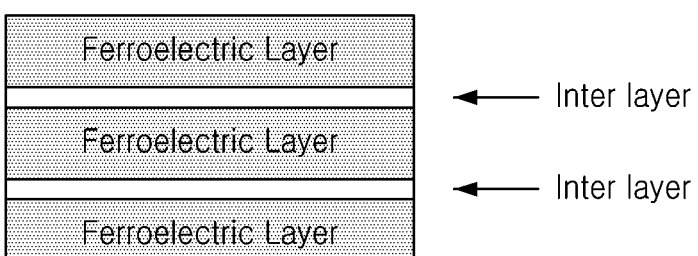
Figure 5A:
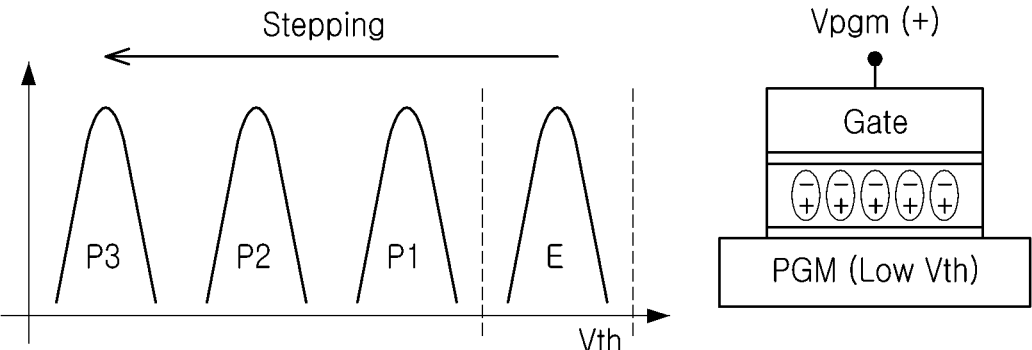
Figure 5B:
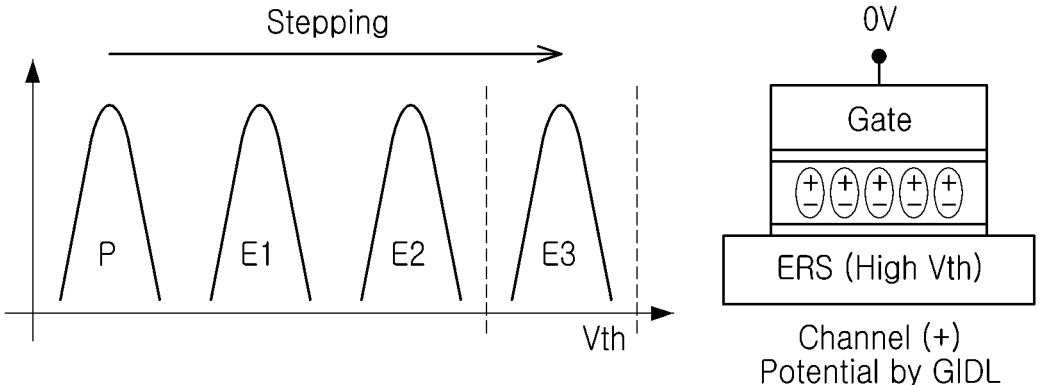
Figure 6:
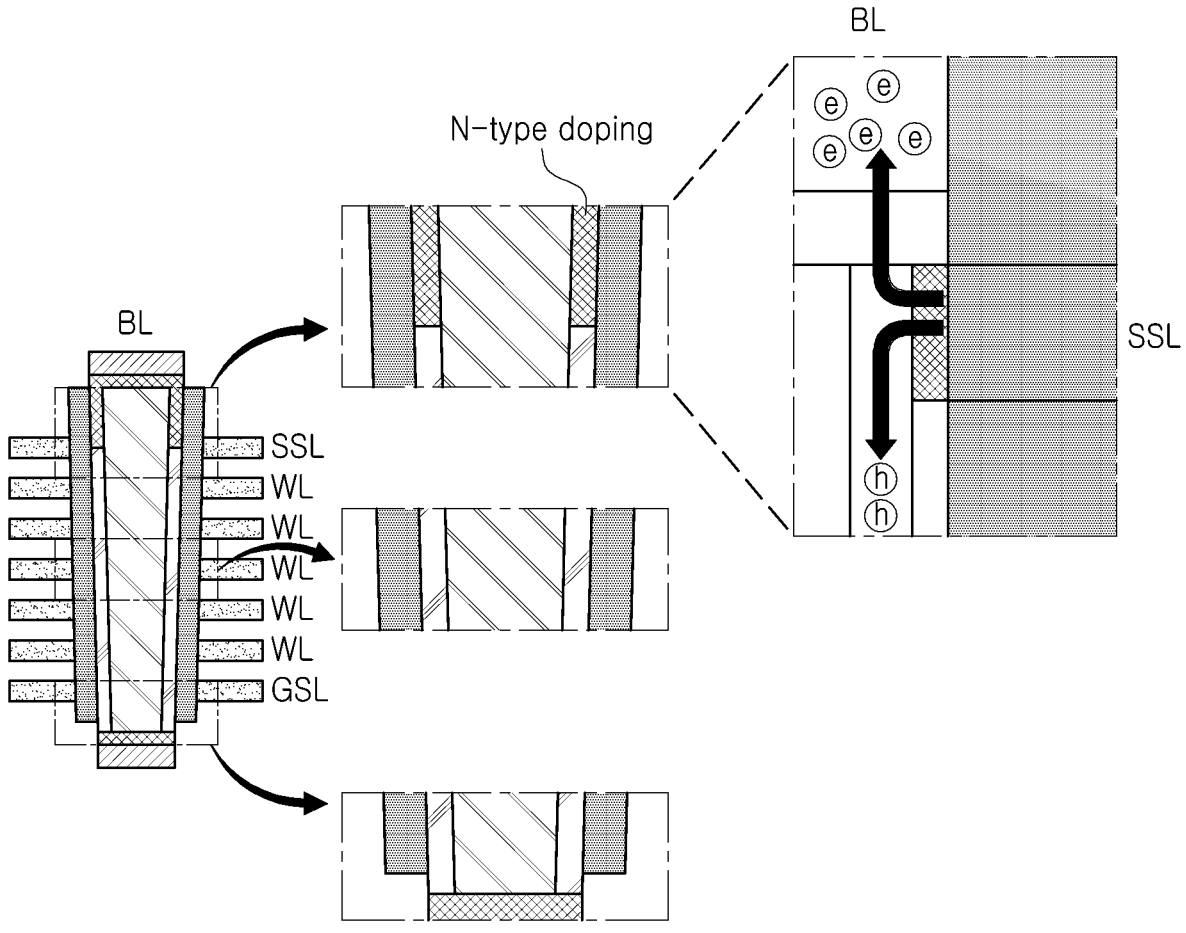
Figures 7A, 7B:
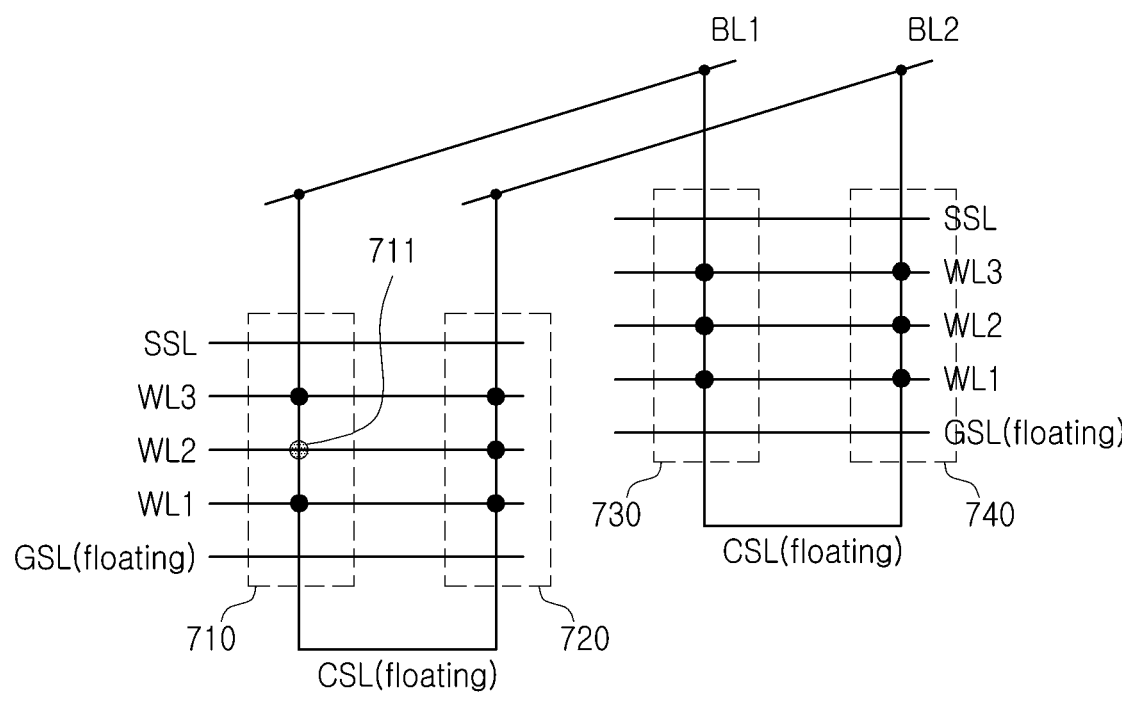
Figures 8A, 8B:
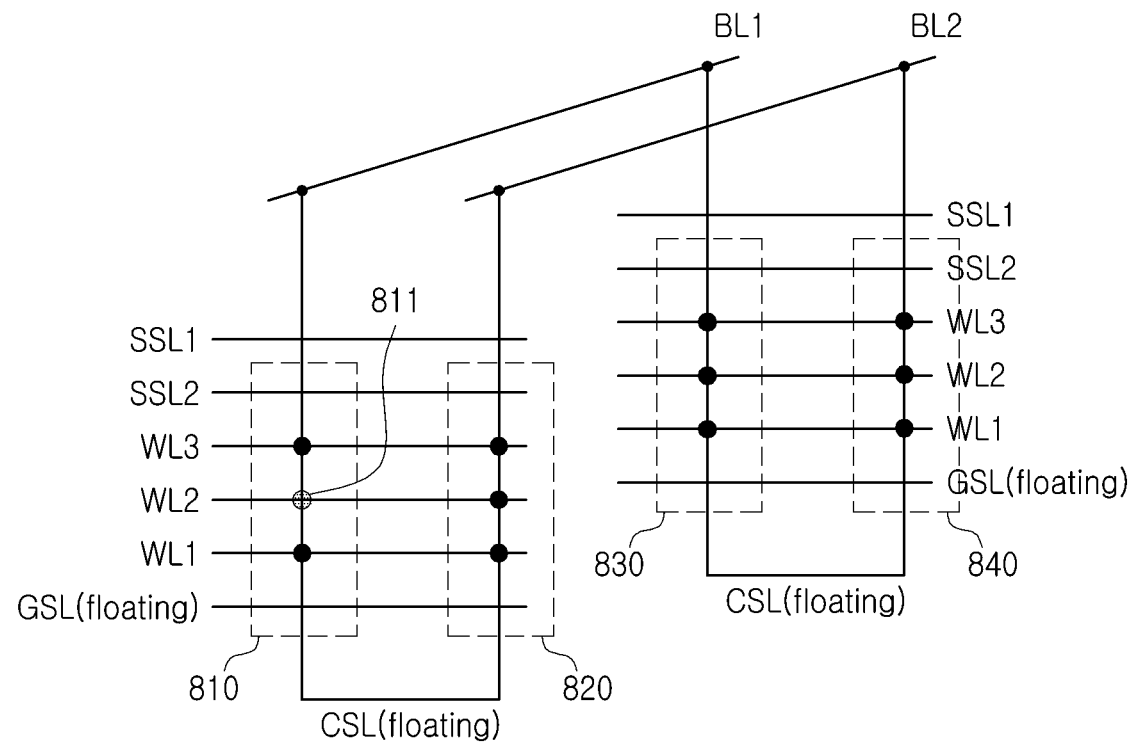
Figure 9:
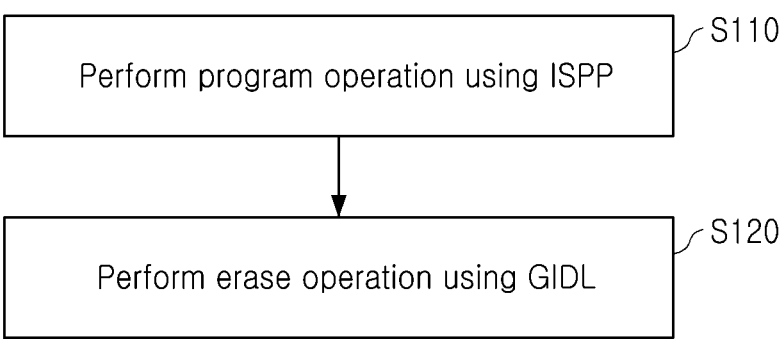
Figure 10:
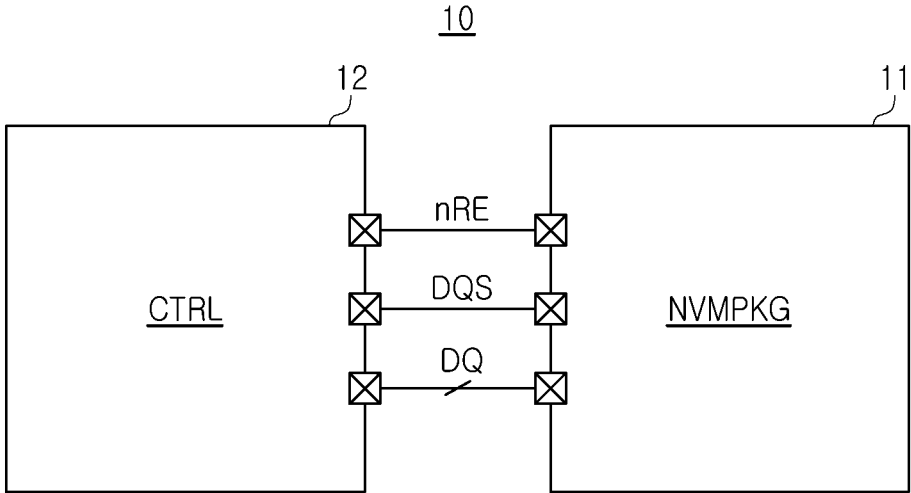

FIGS. 3A, 3B, 3C, 3D, 3E, and 3F are diagrams illustrating cross-sectional views of a nonvolatile memory device, by way of example;

FIGS. 4A and 4B are diagrams illustrating a ferroelectric layer according to an example embodiment by way of example;

FIGS. 5A and 5B are diagrams conceptually illustrating bidirectional distributions in a program operation and an erase operation of the nonvolatile memory device 100 according to an example embodiment;

FIG. 6 is a diagram illustrating GIDL operation of a nonvolatile memory device according to an example embodiment;

FIGS. 7A and 7B are diagrams illustrating operating conditions of an erase operation of a nonvolatile memory device according to an example embodiment;

FIGS. 8A and 8B are diagrams illustrating operating conditions of an erase operation of a nonvolatile memory device according to another embodiment;

FIG. 9 is a flowchart illustrating the operation of a nonvolatile memory device according to an example embodiment; and FIG. 10 is a diagram illustrating a storage device 10 according to an example embodiment.

DETAILED DESCRIPTION OF EMBODIMENTS

Hereinafter, the content of the present inventive concept will be described clearly and in detail with reference with the drawings, so that a person skilled in the art may easily carry out the present inventive concept. The terms "first," "second," etc., may be used herein merely to distinguish one component, layer, direction, etc. from another. The terms "comprises," "comprising," "includes" and/or "including," when used herein, specify the presence of stated elements, but do not preclude the presence of additional elements. The term "and/or" includes any and all combinations of one or more of the associated listed items. The term "connected" may be used herein to refer to a physical and/or electrical connection. When components or layers are referred to herein as "directly on" or "in direct contact" or "directly connected," no intervening components or layers are present.

In a nonvolatile memory device having a ferroelectric material, a storage device having the same, and a method of operating the same according to an example embodiment, selective erase operations may be performed in small units of cells, strings, or planes using Gate Induced Drain Leakage (GIDL). The nonvolatile memory device, the storage device, and the operating method may improve up to all threshold voltage distributions in the program direction and erase direction. The nonvolatile memory device may perform an erase inhibit operation using at least two string selection transistors. In detail, the nonvolatile memory device with the ferroelectric material performs an erase operation by injecting hole current into the channel through GIDL, and by applying a voltage for an erase prohibition condition using a string selection line, a selective erase operation may be performed on units smaller than the bulk (i.e., on subsets of transistors), such as cells/strings/planes. In such instances, the string selection line may be connected to two or more string selection transistors to increase erase inhibition efficiency. As a result, the present inventive concept may be expected to improve erase inhibition efficiency and improve distribution.

Figure 1:
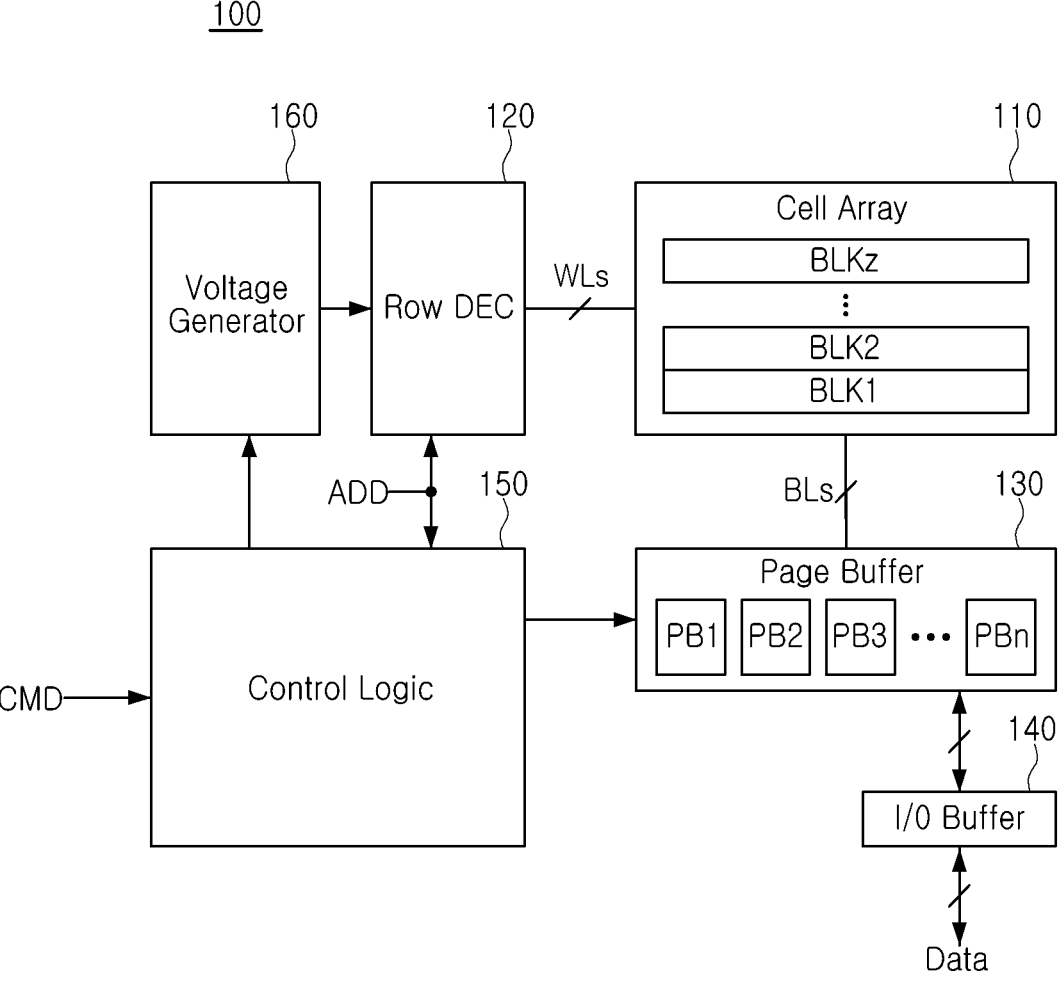
FIG. 1 is a diagram illustrating a nonvolatile memory device 100 according to an example embodiment.

FIG. 1 is a diagram illustrating a nonvolatile memory device 100 according to an example embodiment. Referring to FIG. 1, the nonvolatile memory device 100 may include a memory cell array 110, a row decoder 120, a page buffer circuit 130, an input/output buffer circuit 140, a control logic 150, and a voltage generator 160.

The memory cell array 110 may be connected to the row decoder 120 through wordlines (WLs) or selection lines (SSL, GSL). The memory cell array 110 may be connected to the page buffer circuit 130 through bitlines BLs. The memory cell array 110 may include a plurality of cell strings. Each channel of the cell strings may be formed in a vertical direction. Each of the cell strings may include a plurality of memory cells. In this case, a plurality of memory cells may be programmed, erased, or read by voltage provided to bitlines (BLs) or wordlines (WLs). Each of the plurality of memory cells may include a ferroelectric material. Details of the memory cell of the present inventive concept are described, for example, in U.S. Pat. No. 11,456,319 filed by Samsung Electronics, the disclosure of which is incorporated by reference herein.

The row decoder 120 may be implemented to select one of the memory blocks BLK1 to BLKz of the memory cell array 110 in response to the address ADD. The row decoder 120 may select one of the wordlines of the selected memory block in response to the address ADD. The row decoder 120 may transmit a wordline voltage (VWL) corresponding to the operation mode to the wordline of the selected memory block. During a program operation, the row decoder 120 may apply a program voltage and a verification voltage to the selected wordline and a pass voltage to the unselected wordline. During a read operation, the row decoder 120 may apply a read voltage to the selected wordline and a read pass voltage to the unselected wordline.

The page buffer circuit 130 may be implemented to operate as a write driver or a sensing amplifier. During a program operation, the page buffer circuit 130 may apply a bitline voltage corresponding to data to be programmed to the bitlines of the memory cell array 110. During a read operation or a verification read operation, the page buffer circuit 130 may sense data stored in the selected memory cell through the bitline BL. Each of the plurality of page buffers (PB1 to PBn, n is an integer of 2 or more) included in the page buffer circuit 130 may be connected to at least one bitline.

Each of the plurality of page buffers (PB1 to PBn) may be implemented to perform sensing and latch to perform an on-chip valley search (OVS) operation. For example, each of the page buffers PB1 to PBn may perform a plurality of sensing operations to identify a state stored in the selected memory cells under the control of the control logic 150. Additionally, each of the page buffers PB1 to PBn stores data sensed through a plurality of sensing operations and then selects one data under the control of the control logic 150. For example, each of the page buffers PB1 to PBn may perform a plurality of sensing operations to identify one state. Additionally, each of the plurality of page buffers (PB1 to PBn) may select or output desired or optimal data from a plurality of pieces or units of sensed data under the control of the control logic 150.

The input/output buffer circuit 140 provides external data to the page buffer circuit 130. The input/output buffer circuit 140 may provide an external command (CMD) to the control logic 150. The input/output buffer circuit 140 may provide an externally provided address (ADD) to the control logic 150 or the row decoder 120. In addition, the input/output buffer circuit 140 may output data sensed and latched by the page buffer circuit 130 to the outside.

The control logic 150 may be implemented to control the row decoder 120, the page buffer circuit 130, the input/output buffer circuit 140, or the voltage generator 160 in response to a command (CMD) transmitted from the outside. On the other hand, the control logic 150 may be implemented to perform processing to select desired or optimal data from a plurality of pieces of sensed data. To select desired or optimal data, the control logic 150 may refer to the count result provided from the cell counter. The cell counter may be implemented to count memory cells corresponding to a specific threshold voltage range from data sensed by the page buffer circuit 130. For example, the cell counter processes data sensed in each of a plurality of page buffers (PB1 to PBn), and the number of memory cells having a threshold voltage within a specific threshold voltage range may be counted.

The voltage generator 160 may be implemented to generate various types of wordline voltages to be applied to each wordline and a well voltage to be supplied to the bulk (e.g., well area) where memory cells are formed, under the control of control logic 150. Wordline voltages applied to each wordline may include a program voltage, a pass voltage, a read voltage, a read pass voltage, and an erase voltage.

In an embodiment of the present invention, the nonvolatile memory device 100 performs an erase operation/erase inhibition operation using GIDL, enabling improvements in the distribution of the program operation direction and the erase operation direction.

Figure 2:
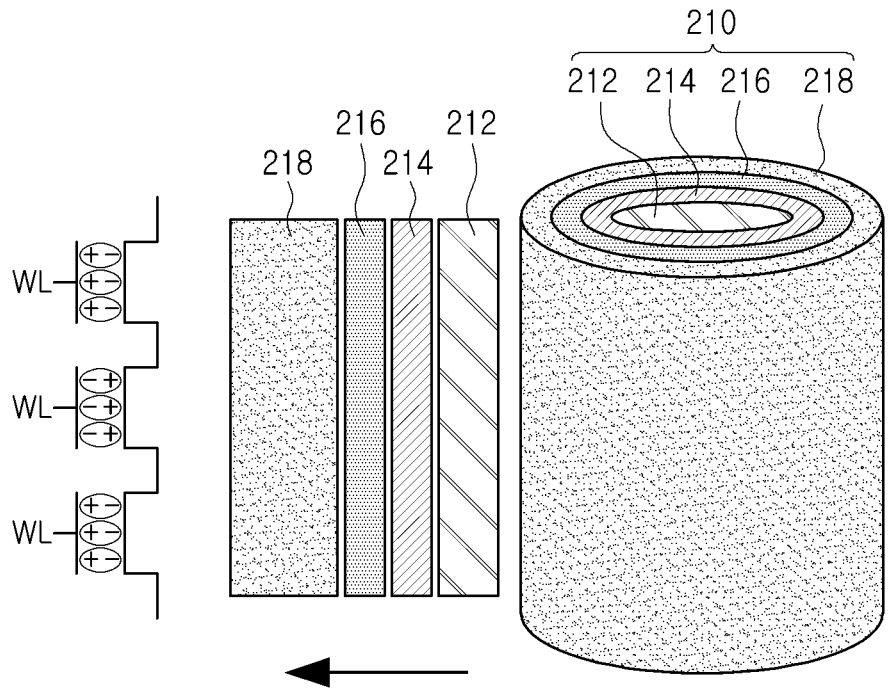
FIG. 2 is a diagram illustrating a cell transistor 210 according to an example embodiment.

FIG. 2 is a diagram illustrating a cell transistor 210 according to an example embodiment. Referring to FIG. 2, the cell transistor 210 may include a channel 212 (pillar oxide film), an interface layer 214, a ferroelectric layer 216, and a control gate 218.

The nonvolatile memory device 100 may be expected to operate at low power and high speed when using the cell transistor 210 used as a memory cell. The cell transistor 210 varies the threshold voltage by switching a dipole, and the operation voltage direction and threshold voltage behavior of the program operation and the erase operation may be opposite to those of the Charge Trap Flash (CTF) device. For example, when a (+) voltage is applied to the gate, the CTF moves in the direction in which the threshold voltage increases, while the Ferroelectric-gate Field Effect Transistor (FeFET) moves in the direction in which the threshold voltage decreases. By using Incremental Step Pulse Programming (ISPP) operating voltage, the threshold voltage of FeFET may be distributed in the direction of lowering. Using the GIDL erase operation, scatter collection is possible even in the direction where the threshold voltage increases. Like the block erase operation, simultaneous erase operations are also possible. However, bidirectional scatter collection operations are possible using the GIDL erase operation.

On the other hand, the stacked structure of the nonvolatile memory device 100 may be implemented in various ways.

FIGS. 3A to 3F are diagrams illustrating exemplary cross-sectional views of a nonvolatile memory device.

Figure 3A:
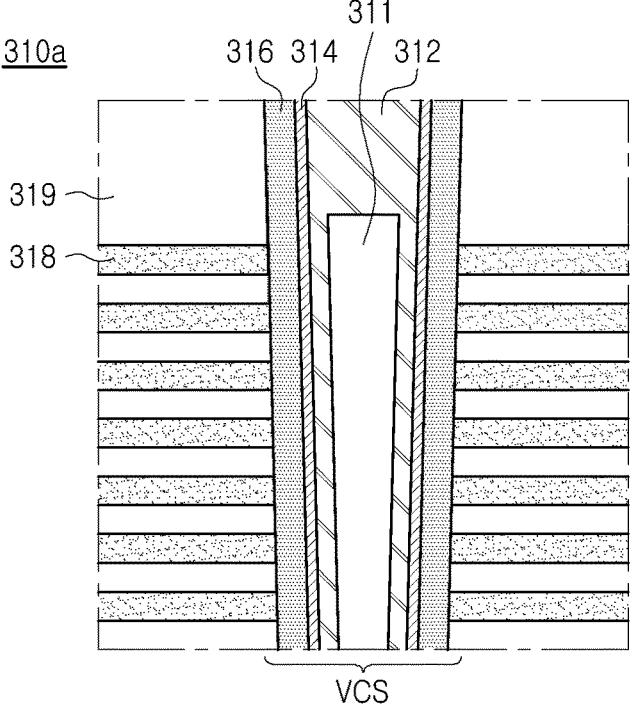

Referring to FIG. 3A, the stacked structure 310a may include a vertical channel structure VCS penetrating the wordline substrates 318 stacked on the substrate. The vertical channel structure VCS may be implemented in a vertical direction from the substrate. The vertical channel structure VCS may have a circular, oval, or bar-shaped top surface. The vertical channel structure VCS may include an oxide pillar 311, a channel 312, an interface layer 314, and a ferroelectric layer 316.

The ferroelectric layer 316 of the vertical channel structure VCS may have a pipe shape or a macaroni shape (or more generally, a hollow and at least partially cylindrical structure) with an open bottom (i.e., with no bottom surface extending between inner sidewalls thereof). The channel 312 may fill the space surrounded by the interface layer 314 and the conductive pad. Channel 312 may be surrounded by a portion of interfacial layer 314. The terms "surround" or "cover" or "fill" as may be used herein may not require completely surrounding or covering or filling the described elements or layers, but may, for example, refer to partially surrounding or covering or filling the described elements or layers. The upper surface of the channel 312 may be in contact with a conductive pad, and the lower surface of the channel 312 may be in contact with a portion of the interface layer 314. Channel 312 may be electrically floating from the substrate. Channel 312 may include a silicon-based material capable of diffusing holes. For example, the channel 312 may include a semiconductor material doped with an impurity, an intrinsic semiconductor material that is not doped with an impurity, or a polycrystalline semiconductor material. For example, the channel 312 may include polysilicon doped with impurities of the same conductivity type (e.g., P-type) as the substrate 100. The channel 312 may have excellent hole mobility, and thus may assist hole injection and diffusion due to Gate Induced Drain Leakage (GIDL) in at least one of the gate electrodes. Holes may be more easily transmitted to the interface layer 314 by the channel 312. For example, the channel 312 may enable hole injection-based memory operation, and thus the electrical characteristics of the nonvolatile memory device according to the present inventive concept may be improved.

In an example embodiment, the channel 312 may include an oxide semiconductor layer and a silicon semiconductor layer. In this case, the thickness of the oxide semiconductor layer may be thinner than the thickness of the silicon semiconductor layer. In an example embodiment, the oxide semiconductor layer may include at least one of indium gallium zinc oxide (IGZO), Indium Tungsten Oxide (IWO), Indium Tin Gallium Oxide (ITGO), Indium Aluminum Zinc Oxide (IAGO), Indium Gallium Oxide (IGO), Indium Tin Zinc Oxide (ITZO), ZTO (zinc tin) oxide), indium zinc oxide (IZO), ZnO, indium gallium silicon oxide (IGSO), indium oxide (InO), tin oxide (SnO), titanium oxide (TiO), zinc oxynitride (ZnON), magnesium zinc oxide (MgZnO), indium zinc oxide (InZnO), indium gallium zinc oxide (InGaZnO), zirconium indium zinc oxide (ZrInZnO), hafnium indium zinc oxide (HfInZnO), tin indium zinc oxide (SnInZnO), aluminum tin indium zinc oxide (AlSnInZnO), silicon indium zinc oxide (SiInZnO), zinc tin oxide (ZnSnO), aluminum zinc tin oxide (AlZnSnO), gallium zinc tin oxide (GaZnSnO), zirconium zinc tin oxide (ZrZnSnO), and indium gallium silicon oxide (InGaSiO). The two-dimensional material layer with semiconductor properties may include at least one of a Transition Metal Dichalcogenide material layer (TMD material layer) and a black phosphorous material layer.

The interface layer 314 may have a hollow and at least partially cylindrical structure (e.g., a pipe shape or macaroni shape) with a closed bottom (i.e., with a bottom surface extending between inner sidewalls thereof). The interface layer 314 may cover the sidewall of the ferroelectric layer 316. The interfacial layer 314 may include an oxide semiconductor material that may block, suppress, or minimize leakage current. The interface layer 314 may include an oxide semiconductor material or a group 4 semiconductor material containing at least one of In, Zn, or Ga, which has excellent leakage current characteristics. The interface layer 314 may include, for example, a ZnOx-based material including AZO, ZTO, IZO, ITO, IGZO, or Ag—ZnO. The interfacial layer 314 may block, suppress, or minimize leakage current to the gate electrodes or the substrate, and the transistor characteristics (e.g., threshold voltage distribution and speed of program/read operations) of at least one of the gate electrodes may be improved. Accordingly, the electrical characteristics of the nonvolatile memory device according to the present inventive concept may be improved.

The ferroelectric layer 316 may have polarization characteristics depending on the electric field applied by the conductive electrode, and may have remnant polarization due to a dipole even in the absence of an external electric field. Data may be recorded using the polarization state of the ferroelectric layer 316. The ferroelectric layer 316 may cover the inner wall of the channel hole and may contact the sidewalls of the gate electrodes. The ferroelectric layer 316 may have a single-layer structure containing a ferroelectric material. The ferroelectric layer 316 may include, for example, at least one of HfOx, PZT(Pb(Zr, Ti)O$_3$), PTO (PbTiO$_3$), SBT(SrBi$_2$Ti$_2$O$_3$), BLT(Bi(La, Ti)O$_3$), PLZT(Pb (La, Zr)TiO$_3$), BST(Bi(Sr, Ti)O$_3$), barium titanate (BaTiO$_3$), P(VDF-TrFE), PVDF, AlOx, ZnOx, TiOx, TaOx or InOx, doped with at least one material of HfOx, Al, Zr, or Si having an orthorhombic crystal structure.

Each of the intermediate insulating films 319 between the stacked wordline substrates may have different thicknesses. For example, the lowest and uppermost of the interlayer insulating films 319 may have a smaller thickness than the other interlayer insulating films. On the other hand, the present inventive concept is not limited thereto, and each of the interlayer insulating films 319 has a different thickness, and the thickness of each interlayer insulating film 319 may vary, depending on the characteristics of the semiconductor device. In an example embodiment, each of the interlayer insulating films 319 may include silicon oxide.

Figure 3B:
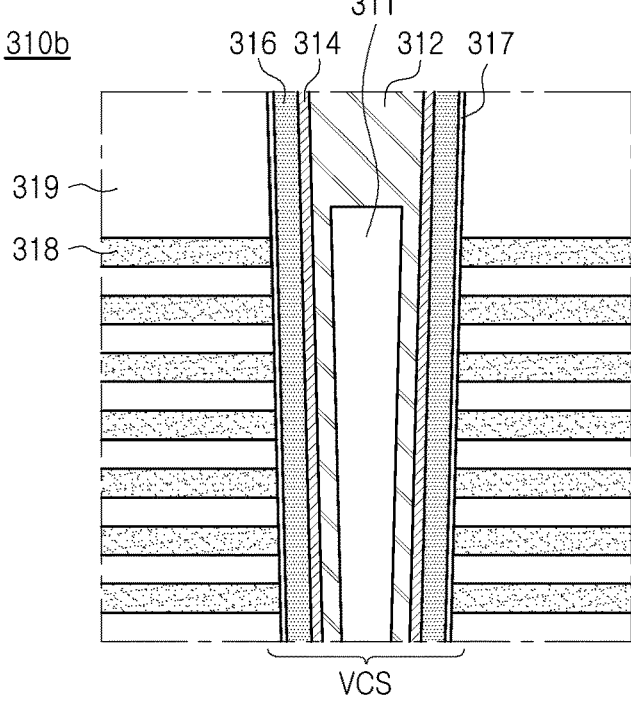

The stacked structure 310*b* illustrated in FIG. 3B is compared to that of the stacked structure 310*a* illustrated in FIG. 3A. A gate-side interfacial layer (317) may be further included between the wordline substrate 318 and the ferroelectric layer 316. In an example embodiment, the gate-side interfacial layer 317 may be implemented with SiO$_2$, HfO, AlO, SiON, SiN, TiO, and NbO.

Figure 3C:
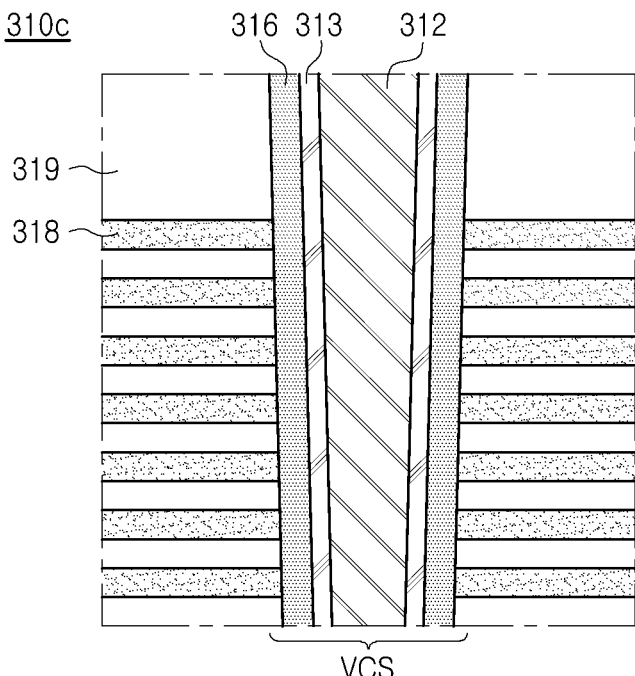

The stacked structure 310*c* illustrated in FIG. 3C has a structure minus the oxide (e.g., silicon oxide) pillar 311 compared to the stacked structure 310*a* illustrated in FIG. 3A. The stacked structure 310*c* may include a channel 312, an oxide semiconductor channel 313, and a ferroelectric layer 316. In an example embodiment, the oxide semiconductor channel 313 may be implemented as IGZO, IWO, or IZO.

Figure 3D:
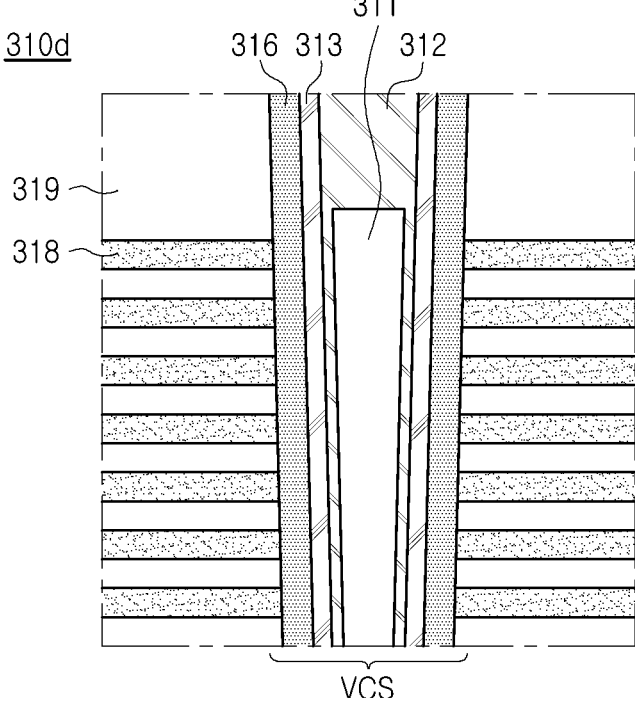

The stacked structure 310*d* illustrated in FIG. 3D may further include oxide pillars 311 compared to the stacked structure 310*c* illustrated in FIG. 3C. In an example embodiment, the oxide pillar 311 may be implemented as SiO$_2$.

Figure 3E:
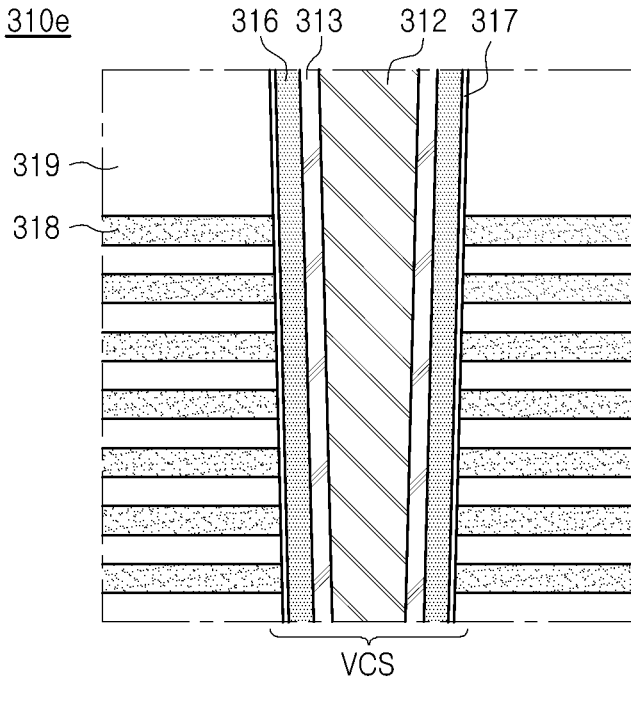

The layered structure 310*e* illustrated in FIG. 3E may further include a gate-side interfacial layer 317 between the wordline substrate 318 and the ferroelectric layer 316, as compared to that of the layered structure 310*c* illustrated in FIG. 3C.

Figure 3F:
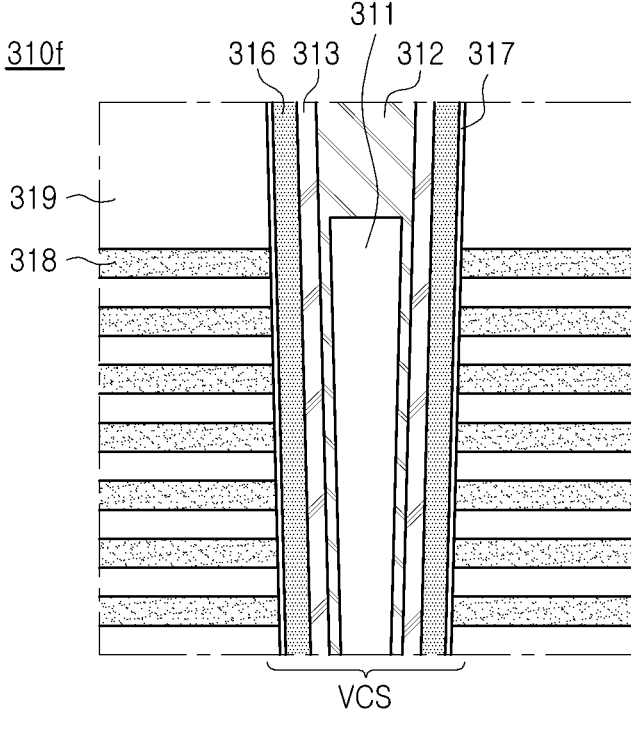

The stacked structure 310*f* illustrated in FIG. 3F may further include an oxide pillar 311 compared to that of the stacked structure 310*e* illustrated in FIG. 3E.

FIGS. 4A and 4B are diagrams exemplarily illustrating a ferroelectric layer according to an example embodiment.

The ferroelectric layer 416 illustrated in FIG. 4A may be implemented as a single layer (signal layer). An inter-layer may be disposed between the ferroelectric layers 416*a* illustrated in FIG. 4B. In embodiments, the inter-layer may be implemented with SiO$_2$, HfO, AlO, or SiON.

FIGS. 5A and 5B are diagrams conceptually illustrating bidirectional distributions in the program operation and erase operation of the nonvolatile memory device 100 according to an example embodiment.

The program operation illustrated in FIG. 5A may be performed by applying a program voltage (Vpgm) to the gate. In this case, the program voltage (Vpgm) may be a positive voltage. In an example embodiment, by increasing or reducing the program voltage (Vpgm) by stepping, the program distribution may be moved to a lower voltage level. During program operation, an incremental program pulse is applied to the wordline corresponding to the selected memory cell, and the program status of the selected memory cell is verified, and when the selected memory cell is programmed, the program operation may be prohibited.

The erase operation illustrated in FIG. 5B may be performed by applying the erase voltage (ERS) to the common source line CSL. Here the channel may be connected to the common source line CSL. In this case, the erase voltage (ERS) may be a positive voltage. In an example embodiment, by increasing the erase voltage (ERS) by stepping, the erase distribution may be moved to a higher voltage level. The erase operation may be performed using a Gate Induced Drain Leakage (GIDL) operation.

FIG. 6 is a diagram illustrating GIDL operation of a nonvolatile memory device according to an example embodiment. Referring to FIG. 6, a string disposed in a direction perpendicular to the substrate may be connected between the bitline BL and the common source line CSL. In this case, the string may include at least one string selection transistor, a plurality of memory cells corresponding to wordlines, and at least one ground selection transistor. The string selection transistor may have a gate connected to a string selection line SSL. Each of the plurality of memory cells may have a gate connected to the wordline WL. A ground selection transistor may have a gate connected to a ground selection line GSL.

In an example embodiment, the BL pad is placed below the bitline BL and may be implemented in a macaroni or other hollow and at least partially cylindrical structure. In an example embodiment, the wordline WL is implemented in a plate or substantially planar shape perpendicular to the substrate, and the thickness of the plate may be implemented to be 40 nm or less. The thickness of the insulating layer between wordlines may be 40 nm or less. In an example embodiment, the thickness of the ferroelectric layer may be 10 nm or less. In an example embodiment, the thickness of the interface layer may be 20 nm or less. On the other hand, it should be understood that the thickness of the wordline plate, the thickness of the insulating layer, the thickness of the ferroelectric layer, and the thickness of the interface layer are not limited thereto.

In an example embodiment, the string selection transistor SSL may be implemented as a GIDL transistor. As illustrated in FIG. 6, the GIDL transistor makes the n-type doping or dopant concentration of the channel corresponding to the string selection line SSL higher than that of other parts. At this time, an erase operation may be performed by channel potential boosting by injecting holes into the channel using the GIDL operation. On the other hand, pass disturbance may be suppressed by applying the pass voltage of adjacent cells at the same level as the channel potential.

The nonvolatile memory device 100 of the present inventive concept may selectively perform the erase operation only on a desired or required cell, string, SSL, or plane basis, via GIDL operation, unlike in existing nonvolatile memory devices where the entire block is erased and then the program is performed again. Additionally, by performing an erase operation by stepping, the erase distribution may be improved compared to the one shot or single voltage distribution, and the area of the spare block may be effectively reduced.

FIGS. 7A and 7B are diagrams illustrating operating conditions of an erase operation of a nonvolatile memory device according to an example embodiment.

The nonvolatile memory device is disposed in a direction perpendicular to the substrate, and may include a plurality of strings 710, 720, 730, and 740 connected between respective bitlines BL1 and BL2 and the common source line CSL. Each of the plurality of strings 710, 720, 730, and 740 may include a string selection transistor having a gate connected to a string selection line SSL, a plurality of memory cells having gates connected to each of a plurality of wordlines WL1, WL2 and WL3, and a ground selection transistor with gate connected to ground selection line GSL. Each of the plurality of memory cells may be connected to wordlines WL1, WL2 and WL3 arranged in a direction perpendicular to the substrate.

As illustrated in FIG. 7A, in the nonvolatile memory device, due to the occurrence of Gate Induced Drain Leakage (GIDL) according to the voltage (e.g., 2V) applied to each of the bitlines BL1 and BL2 located at the top of the string and at least one string selection line SSL1, holes may be injected and diffuse into the channel. Depending on the occurrence of such GIDL, an erase operation may be performed on at least one string.

At least one string including the target memory cell 711 on which the erase operation is performed may be referred to as the target string 710. Among the plurality of wordlines WL1, WL2 and WL3, the one corresponding to the target memory cell 711 may be referred to as the selected wordline WL2, and among the plurality of wordlines WL1, WL2 and WL3, those corresponding to memory cells other than the target memory cell 711 may be referred to as unselected wordlines WL1 and WL3.

A plurality of wordlines WL1, WL2 and WL3 may correspond to the gate electrodes of FIGS. 3A to 3F, and the number of wordlines WL1, WL2 and WL3 is illustrative and the present inventive concept is not limited thereto. The string selection line provided on the wordlines WL1, WL2 and WL3 may be referred to as at least one string selection line SSL.

The ground selection line GSL and common source line CSL provided below the wordlines WL1, WL2, and WL3 may be electrically floating. A plurality of wordlines WL1, WL2 and WL3, a ground selection line GSL, and a common source line CSL may be connected to the strings in a horizontal direction, and the bitlines BL1 and BL2 may be connected to the strings in a vertical direction.

In more detail, the method of operating the nonvolatile memory device 100 may include applying an erase voltage (for example, 10V) to the bitline BL1 of the target string 710 including the target memory cell 711, applying a GIDL voltage (e.g., 2V) smaller than the power supply voltage to the string selection line SSL connected to the target string 710, applying a ground voltage (e.g., 0V) to the selected wordline WL2, and applying an erase pass voltage (e.g., 7V) to each of the unselected wordlines WL1 and WL3. Additionally, the operation method of the nonvolatile memory device may further include generating GIDL through the voltage difference between the bitline BL1 and the string selection line SSL, injecting and diffusing holes into channels of the target string 710, and performing a selective erase operation on the target memory cell 711.

In the nonvolatile memory device 100, by controlling a voltage applied to the bitline BL2 of the first adjacent string 720 (a string that shares the string selection line SSL with the target string 710) and a voltage applied to the string selection line SSL of the second adjacent string 730 (a string that shares the target string 710 and the bitline BL1), a selective erase operation may be performed to prevent holes from being injected into each of the first adjacent string 720 and the second adjacent string 730 and to allow holes to be injected only into the target string 710.

Referring to FIG. 7B, in the nonvolatile memory device 100, by applying an erase prohibition voltage (a voltage that is not significantly different from the GIDL voltage applied to at least one selection line SSL, for example, 4V) that is smaller than the erase voltage, to the bitline BL2 of the first adjacent string 720, GIDL is not generated between the bitline BL2 of the first adjacent string 720 and at least one selection line SSL. As a result, holes may be prevented from being injected into the first adjacent string 720. Accordingly, the nonvolatile memory device 100 generates GIDL only between the bitline BL1 and the string selection line SSL of the target string 710, as described above. Holes may be injected and diffused only into the channel of the target string 710. Therefore, a selective erase operation may be performed on the target string 710 including the target memory cell 711.

Additionally, the nonvolatile memory device 100 applies a shut-off voltage (for example, 10V) to the string selection line SSL connected to the second adjacent string 730. GIDL is not generated between the bitline BL1 and the string selection line SSL of the second adjacent string 730. As a result, holes may be prevented from being injected into the second adjacent string 730. Accordingly, the nonvolatile memory device 100 generates GIDL only between the bitline BL1 and the string selection line SSL of the target string 710, as described above. Holes may be injected and diffused only into the channel of the target string 710. Therefore, a selective erase operation may be performed on the target string 710 including the target memory cell 711.

As described above, to perform a selective erase operation on the target string 710 (more precisely, the target memory cell 711), the method of operating the nonvolatile memory device 100 may further include adjusting the values and application timings of erase voltage (e.g., 10V power supply voltage) applied to the bitline BL1 of the target string 710, GIDL voltage (e.g., 2V) applied to at least one selection line SSL connected to the target string 710, ground voltage GND or 0V applied to the selected wordline WL2, erase pass voltage (e.g., 7V) applied to each of the unselected wordlines WL1 and WL3, an erase prohibition voltage (e.g., 4V) applied to the bitline BL2 of the first adjacent string 720, and erase voltage applied to at least one selection line SSL2 connected to the second adjacent string 730.

The nonvolatile memory device 100 according to an example embodiment may implement a selective erase operation for the target string 710 including the target memory cell 711 by adjusting the voltages applied to the target string 710 as well as the adjacent strings 720 and 730, while applying a voltage to selectively generate GIDL between the bitline BL1 of the target string 710 and at least one selection line SSL1.

On the other hand, strings according to example embodiments may be implemented to include a plurality of string selection transistors.

FIGS. 8A and 8B are diagrams illustrating operating conditions of an erase operation of a nonvolatile memory device according to another embodiment.

Referring to FIG. 8A, a plurality of strings 810, 820, 830, and 840 may be connected to each of the bitlines BL1 and BL2. Each of the plurality of strings 810, 820, 830, and 840 may include a first string selection transistor, a second string selection transistor, a plurality of memory cells, and a ground selection transistor. The first string selection transistor may have a gate connected to the first string selection line SSL1 and a drain connected to the corresponding bitline BL1. In an example embodiment, the first string selection transistor may be implemented as a GIDL transistor for GIDL generation. The second string selection transistor may have a gate connected to the second string selection line SSL2 and a drain connected to the source of the first string selection transistor. A plurality of memory cells are connected in series and have gates connected to corresponding wordlines WL1, WL2 and WL3. The ground selection transistor may have its gate connected to the ground selection line GSL.

Compared to that illustrated in FIG. 7A, the nonvolatile memory device illustrated in FIG. 8A may have a target erase area determined by two string selection lines SSL1 and SSL2. For example, a selective erase operation for the target string 810 including the target memory cell 811 may be implemented. In the erase operation conditions of the nonvolatile memory device illustrated in FIG. 8B, compared to that illustrated in FIG. 7B, a first shut-off voltage (for example, 10V) may be applied to the unselected first string selection line SSL1, and a second shut-off voltage (for example, 4V) may be applied to the unselected second string selection line SSL2. For example, during an erase operation, different voltages may be applied to unselected string selection lines.

As described above, the nonvolatile memory device 100 according to an example embodiment applies an erase prohibition voltage condition (which may be less than the erase voltage and less than an erase pass voltage, and may not substantially differ from the GIDL voltage applied to at least one selection line SSL) in a scatter-collection operation, and to improve inhibition efficiency, two or more string selection transistors may be implemented.

The program operation of the nonvolatile memory device according to an example embodiment proceeds in the order of PGM, Verify, and Inhibit, and the distribution may be collected for each multi bit state. In addition, the erase operation of the nonvolatile memory device according to the example embodiment may be prohibited by GIDL erase, may be operated on a SSL/String/Cell/Plane basis, and enables ERS distribution to be improved.

FIG. 9 is a flowchart illustrating the operation of a nonvolatile memory device according to an example embodiment. Referring to FIGS. 1 to 9, the nonvolatile memory device 100 may operate as follows.

The nonvolatile memory device 100 may perform a program operation to collect distributions in a first direction (the direction in which the threshold voltage is lowered) using ISPP (Incremental Step Pulse Programming) at block S110. The nonvolatile memory device 100 may perform an erase operation to collect distributions in a second direction (the direction in which the threshold voltage increases) using GIDL at block S120. In this case, the second direction may be opposite to the first direction. On the other hand, since the erase operation of the present inventive concept is performed in the second direction where the threshold voltage increases, in some cases, the erase operation may also be referred to as a program operation.

In an example embodiment, during a program operation, an incremental program pulse is applied to a wordline corresponding to the selected memory cell, and the program status of the selected memory cell is verified, and when the selected memory cell is programmed, the program operation may be inhibited. In an example embodiment, the erase operation may be performed on a cell-by-cell, string-by-string, or plane-by-plane basis. In an example embodiment, the at least one string selection transistor may include a first string selection transistor having a gate connected to a first string selection line, and a second string selection transistor having a gate connected to a second string selection line. In an example embodiment, during an erase operation, a GIDL voltage is applied to the first and second string selection lines corresponding to a string selected from a plurality of strings, and different shut-off voltages may be applied to the first and second string selection lines corresponding to unselected strings among the plurality of strings. In an example embodiment, the common source line CSL and/or ground selection line GSL may be floating during an erase operation.

FIG. 10 is a diagram illustrating a storage device 10 according to an example embodiment. Referring to FIG. 10, the storage device 10 may include a nonvolatile memory package 11 (NVM PKG) and a controller 12 (CTRL) that controls operations of the nonvolatile memory package 11.

The nonvolatile memory package 11 (NVM PKG) may include an interface chip (frequency boosting interface chip (FBI), or 'buffer chip') and a plurality of nonvolatile memory devices connected to internal channels. The interface chip (FBI) may be connected to the controller 12 through a channel. In this case, the channel may be connected to the first internal channel or the second internal channel through an interface chip. The interface chip may internally include a retraining check circuit that determines the need for retraining. In an example embodiment, the retraining check circuit may include a Built-In Self-Test (BIST) circuit, an oscillator, or a Delayed Locked Loop (DLL) circuit. Additionally, the interface chip may implement an interface protocol for communicating with the controller 12 and an interface protocol for communicating with nonvolatile memory devices to be compatible. Each of the nonvolatile memory devices may be implemented to store data. A plurality of nonvolatile memory devices may be connected to each of the internal channels. In an example embodiment, the nonvolatile memory package 11 may be implemented in a structure in which nonvolatile memory devices are stacked.

The controller (CTRL) 12 may be implemented to control the overall operation of the nonvolatile memory package 11 through at least one control signal (e.g., nRE), data strobe signal (DQS), or data signal (DQ). The controller 12 may perform functions required for data management of the nonvolatile memory package 11, such as address mapping, error correction, garbage collection, wear-leveling, bad block management, data correction, or the like. In this case, these functions may be implemented in hardware, software, or firmware.

The controller 12 may include a host interface circuit, a volatile memory interface circuit, a bus, at least one processor, a buffer memory, an error correction circuit, a host DMA circuit, and a nonvolatile memory DMA circuit.

The host interface circuit may be implemented to transmit and receive packets to and from the host. Packets transmitted from the host to the host interface circuit may include commands or write data to a nonvolatile memory device. Packets transmitted from the host interface circuit 201 to the host may include a response to a command or read data from a nonvolatile memory device.

The memory interface circuit may transmit write data to the nonvolatile memory or receive read data from the nonvolatile memory. The memory interface circuits may be implemented to comply with standard conventions such as Joint Electron Device Engineering Council (JEDEC) Toggle or Open NAND Flash Interface (ONFI).

At least one processor may be implemented to control the overall operation of the storage device 10. The processor may perform various management operations such as cache/buffer management, firmware management, garbage collection management, wear leveling management, data deduplication management, read refresh/reclaim management, bad block management, multi-stream management, mapping management of host data and nonvolatile memory, Quality of Service (QoS) management, system resource allocation management, nonvolatile memory queue management, read level management, erase/program management, hot/cold data management, power loss protection management, dynamic thermal management, initialization management, Redundant Array of Inexpensive Disk (RAID) management, or the like. These management operations may be implemented in hardware/firmware/software.

The buffer memory may temporarily store data to be written to a nonvolatile memory device or read data from a nonvolatile memory device. In an example embodiment, the buffer memory may be provided within the controller 12. In other embodiments, the buffer memory may be placed or implemented external to controller 12. Additionally, the buffer memory may be implemented with volatile memory (e.g., Static Random Access Memory (SRAM), Dynamic RAM (DRAM), Synchronous RAM (SDRAM), etc.) or nonvolatile memory (flash memory, phase-change RAM (PRAM), magneto-resistive RAM (MRAM), resistive RAM (ReRAM), ferroelectric RAM (FRAM), or the like).

The error correction circuit may be implemented to generate an error correction code (ECC) during a program operation and to recover data using the error correction code during a read operation. For example, the error correction circuit may generate an error correction code (ECC) to correct fail bits or error bits of data received from the nonvolatile memory device. Additionally, the error correction circuit performs error correction encoding of data provided to the nonvolatile memory device, and may form data with a parity bit added. Parity bits may be stored in a nonvolatile memory device.

Additionally, the error correction circuit may perform error correction decoding on data output from the nonvolatile memory device. The error correction circuit may correct errors using parity. The error correction circuit may correct errors using coded modulation such as Low Density Parity Check (LDPC) code, BCH code, turbo code, Reed-Solomon code, convolution code, Recursive Systematic Code (RSC), Trellis-Coded Modulation (TCM), Block Coded Modulation (BCM), or the like. On the other hand, when error correction is not possible in the error correction circuit, a read retry operation may be performed.

The packet manager may generate packets according to the protocol of the interface negotiated with the host or parse various information from packets received from the host. The encryption device may perform at least one of an encryption operation and a decryption operation on data input to the controller 12 using a symmetric-key algorithm. The encryption device may encrypt and decrypt data using the Advanced Encryption Standard (AES) algorithm. The cryptographic device may include an encryption module and a decryption module. In an example embodiment, the encryption device may be implemented in hardware/software/firmware. The cryptographic device may perform Self Encryption Disk (SED) function or Trusted Computing Group (TCG) security function. The SED function uses an encryption algorithm to store encrypted data in a nonvolatile memory device, or encrypted data may be decrypted from nonvolatile memory devices. These encryption/decryption operations may be performed using an internally generated encryption key. The TCG security function may provide a mechanism to enable access control to user data on the storage device 10. For example, the TCG security function may perform an authentication procedure between an external device and the storage device 10. In embodiments, the SED function or the TCG security function may be optionally selected.

The host DMA circuit may be implemented to control DMA operations between the host device and controller 12. The host DMA circuit may store data input from the host device through the host interface into a buffer memory during write operation under the control of the host controller. Additionally, the host DMA circuit may output data stored in the buffer memory to the host device through the host interface during a read operation. In an example embodiment, the host DMA circuit may be implemented to be included in the host controller as a component of the host controller.

A nonvolatile memory DMA circuit may be implemented to control DMA operations between controller 12 and a nonvolatile memory device. The nonvolatile memory DMA circuit may output data stored in the buffer memory to a nonvolatile memory device through a nonvolatile memory interface circuit during a write operation under the control of the nonvolatile memory controller. Additionally, the nonvolatile memory DMA circuit may perform an operation of reading data stored in a nonvolatile memory device through a nonvolatile memory interface circuit during a read operation.

The device described above may be implemented with hardware components, software components, and/or a combination of hardware components and software components. For example, the devices and components described in the example embodiments may be implemented using one or more general-purpose computers or special-purpose computers, together with a processor, controller, arithmetic logic unit (ALU), digital signal processor, microcomputer, field programmable gate array (FPGA), programmable logic unit (PLU), microprocessor, or any other devices that may execute and respond to instructions. The processing device may execute an operating system (OS) and one or more software applications running on the operating system. Additionally, a processing device may access, store, manipulate, process, and generate data in response to the execution of software. For ease of understanding, the processing unit may be described as being used in some cases, but those skilled in the art will appreciate that a processing device may include a plurality of processing elements or multiple types of processing elements. For example, a processing device may include a plurality of processors or one processor and one controller. Additionally, other processing configurations, such as parallel processors, are also possible.

Software may include computer programs, code, instructions, or a combination of one or more thereof, and may configure processing units to operate as required or command the processing units independently or collectively. Software and/or data may be embodied in any type of machine, component, physical device, virtual equipment, computer storage medium, or device, to be interpreted by or to provide instructions or data to a processing device. Software may be distributed over networked computer systems and stored or executed in a distributed manner. Software and data may be stored on one or more non-transitory computer-readable recording media.

The method of operating a nonvolatile memory device according to an example embodiment may apply GIDL ERS and Selective ERS in a 3D FeFET VNAND (FeVNAND) structure. In an example embodiment, the FeVNAND Cell structure may be a combination of insulator/Ferroelectric material/Channel material. In an example embodiment, the BL pad structure may include at least one of a macaroni structure (e.g., a hollow, at least partially cylindrical structure) and a filled cylinder structure. In an example embodiment, when an oxide semiconductor and a silicon semiconductor are used in a double channel, the thickness of the oxide semiconductor may be thinner than the thickness of the Si semiconductor. In an embodiment, N+ high doping may be performed in the BL pad and GIDL transistor regions for GIDL generation purposes. That is, the BL pad between a respective bitline and the first string selection transistor may have an n-type dopant concentration that is higher than an n-type dopant concentration of the channel material. In an example embodiment, the Inhibit condition may be satisfied for Selective ERS(Erase) operation. In an example embodiment, a Mid Voltage level shifter transistor capable of operating at 12V or less may be connected to each BL pad for Selective ERS operation. In an embodiment, two or more SSL transistors may be used to increase the efficiency of the inhibit operation, and the voltage of two or more inhibit string selection lines SSLs may be applied differently.

As set forth above, in a nonvolatile memory device, a storage device having the same, and a method of operating the same according to an example embodiment, an erase operation may be performed in various units while improving threshold voltage distribution by using GIDL.

In a nonvolatile memory device, a storage device having the same, and a method of operating the same according to an example embodiment, erase efficiency for unselected strings may be increased by using a plurality of string selection transistors.

While example embodiments have been illustrated and described above, it will be apparent to those skilled in the art that modifications and variations could be made without departing from the scope of the present inventive concept as defined by the appended claims.

What is claimed is:

1. A method of operating a nonvolatile memory device, the method comprising:
applying a ground voltage to a selected wordline among wordlines of the nonvolatile memory device, the nonvolatile memory device comprising a plurality of strings that extend in a direction perpendicular to a substrate and are electrically connected between respective bitlines and a common source line, each of the plurality of strings including at least one string selection transistor, a plurality of memory cells corresponding to the wordlines, and at least one ground selection transistor, and each of the plurality of memory cells comprising a ferroelectric material, the at least one string selection transistor comprising:
a first string selection transistor having a first gate electrically connected to a first string selection line and a first drain electrically connected to a respective bitline among the bitlines, and
a second string selection transistor having a second gate electrically connected to a second string selection line, a second drain electrically connected to a first source of the first string selection transistor, and a second source electrically connected to a respective memory cell among the plurality of memory cells;
applying an erase pass voltage to at least one unselected wordline among the wordlines;
applying an erase voltage, which is greater than the erase pass voltage, to a selected bitline among the bitlines;
applying an erase prohibition voltage, which is less than the erase pass voltage, to an unselected bitline among the bitlines; and
applying a Gate Induced Drain Leakage (GIDL) voltage to at least one string selection line corresponding to a selected string among the plurality of strings,
wherein in an erase operation of at least one memory cell, among the plurality of memory cells, which is electrically connected to the selected wordline and the selected bitline, a first shut-off voltage is applied to the first string selection line corresponding to an unselected string, among the plurality of strings, which is electrically connected to the selected bitline, and a second shut-off voltage is applied to the second string selection line corresponding to the unselected string, wherein the second shut-off voltage is different from the first shut-off voltage.

2. The method of claim 1, wherein the plurality of memory cells respectively comprise the ferroelectric material in combination with an insulator or a channel material.

3. The method of claim 1, wherein a pad of each of the bitlines comprises a hollow and at least partially cylindrical structure.

4. The method of claim 1, wherein each of the plurality of strings comprises a channel electrically connected to the common source line,
wherein the channel includes an oxide semiconductor layer and a silicon semiconductor layer, and
wherein a thickness of the oxide semiconductor layer is less than a thickness of the silicon semiconductor layer in the direction perpendicular to the substrate.

5. The method of claim 1,
wherein a pad between the respective bitline and the first string selection transistor has an n-type dopant concentration that is higher than an n-type dopant concentration of a channel.

6. The method of claim 5, wherein in the erase operation the GIDL voltage is applied to the first string selection line and the second string selection line corresponding to the selected string.

7. The method of claim 6, wherein in the erase operation, the GIDL voltage is applied to the first string selection line and the second string selection line, and the first and second string selection lines are electrically connected to respective selection transistors of an adjacent string, among the plurality of strings, which is electrically connected to the unselected bitline.

8. The method of claim 6, wherein the second shut-off voltage is lower than the first shut-off voltage.

9. The method of claim 1, wherein an erase operation of each of the plurality of memory cells is performed in a unit of one of a cell, a string, or a plane, among the plurality of memory cells, among the plurality of strings, or among a plurality of planes, respectively, of the nonvolatile memory device, and wherein the erase voltage is 12 V or less.

10. A nonvolatile memory device comprising:
a first string electrically connected between a first bitline and a common source line;
a second string electrically connected between a second bitline and the common source line;
a third string electrically connected between the first bitline and the common source line; and
a fourth string electrically connected between the second bitline and the common source line,
wherein each of the first, second, third, and fourth strings comprises a first string selection transistor having a gate electrically connected to a first string selection line, a second string selection transistor having a gate electrically connected to a second string selection line, a plurality of memory cells having respective gates electrically connected to respective ones of a plurality of wordlines, and a ground selection transistor having a gate electrically connected to a ground selection line, and each of the plurality of memory cells comprises a ferroelectric material,
wherein the first string selection line, the second string selection line, the plurality of wordlines, and the ground selection line are sequentially arranged in a direction perpendicular to a substrate,
wherein the nonvolatile memory device is configured to perform an erase operation in which, based on an address, the first string electrically connected to the first bitline is selected, and the second, third, and fourth strings are unselected,
wherein, the erase operation is configured such that, a Gate Induced Drain Leakage (GIDL) voltage is applied to the first string selection line and the second string selection line corresponding to the first string and the second string respectively, and
wherein, the erase operation is configured such that, different shut-off voltages are applied to the first string selection line and the second string selection line corresponding to the third string and the fourth string, respectively.

11. The nonvolatile memory device of claim 10, wherein the erase operation is configured such that, a ground voltage is applied to a wordline selected from among the plurality of wordlines, an erase voltage is applied to the first bitline, an erase prohibition voltage is applied to the second bitline, and the common source line is electrically floated.

12. The nonvolatile memory device of claim 10, wherein the erase operation is configured such that, a wordline pass voltage is applied to an unselected wordline among the plurality of wordlines, and the ground selection line is electrically floated.

13. The nonvolatile memory device of claim 10, wherein the erase operation is configured to be performed on a cell unit, a string unit, or a plane unit, among the plurality of memory cells, among the first, second, third, and fourth strings, or among a plurality of planes, respectively, of the nonvolatile memory device.

14. The nonvolatile memory device of claim 10, wherein a direction of collecting a threshold voltage distribution of the erase operation is opposite to a direction of collecting a threshold voltage distribution of a program operation of the nonvolatile memory device.

18

15. A method of operating a nonvolatile memory device, the method comprising:
performing a program operation on a selected memory cell from among a plurality of memory cells of a respective string among a plurality of strings of the nonvolatile memory device using Incremental Step Pulse Programming (ISPP), wherein the plurality of strings extend in a direction perpendicular to a substrate, and are electrically connected between respective bitlines and a common source line, each of the plurality of strings including at least one string selection transistor, a plurality of memory cells corresponding to wordlines, and at least one ground selection transistor, each of the plurality of memory cells comprising a ferroelectric material, the at least one string selection transistor comprising:
a first string selection transistor having a first gate electrically connected to a first string selection line and a first drain electrically connected to a respective bitline among the bitlines, and
a second string selection transistor having a second gate electrically connected to a second string selection line, a second drain electrically connected to a first source of the first string selection transistor, and a second source electrically connected to a respective memory cell among the plurality of memory cells; and
performing an erase operation on the selected memory cell using Gate Induced Drain Leakage (GIDL), wherein the performing of the erase operation comprises applying different shut-off voltages to first and second string selection lines corresponding to unselected strings among the plurality of strings.

16. The method of claim 15, wherein the performing of the program operation comprises:
applying an incremental program pulse to one of the wordlines corresponding to the selected memory cell during the program operation;
verifying a program state of the selected memory cell; and
inhibiting programming when the program operation of the selected memory cell is completed.

17. The method of claim 15, wherein the erase operation is performed on a unit of a cell, a string, or plane, among the plurality of memory cells, among the plurality of strings, or among a plurality of planes, respectively, of the nonvolatile memory device.

18. The method of claim 15, wherein the performing of the erase operation comprises:
applying a GIDL voltage to the first and second string selection lines corresponding to a string selected from among the plurality of strings.

19. The method of claim 15, wherein a pad of each of the bitlines comprises a hollow and at least partially cylindrical structure.

20. The method of claim 15, wherein each of the plurality of strings comprises a channel electrically connected to the common source line,
wherein the channel includes an oxide semiconductor layer and a silicon semiconductor layer, and
wherein a thickness of the oxide semiconductor layer is less than a thickness of the silicon semiconductor layer in the direction perpendicular to the substrate.

* * * * *